(12) United States Patent
Ronsisvalle

(10) Patent No.: US 7,095,084 B2  
(45) Date of Patent: Aug. 22, 2006

(54) EMITTER SWITCHING CONFIGURATION AND CORRESPONDING INTEGRATED STRUCTURE

(75) Inventor: Cesare Ronsisvalle, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/769,563

(22) Filed: Jan. 30, 2004

(65) Prior Publication Data

US 2004/0262696 A1    Dec. 30, 2004

(30) Foreign Application Priority Data

Jan. 31, 2003    (EP)    ................................ 03425056

(51) Int. Cl.  
*H01L 31/078*    (2006.01)

(52) U.S. Cl. .................. 257/378; 257/516; 257/528

(58) Field of Classification Search ................ 257/378, 257/577, 582, 526, 551, 552, 335, 337, 329, 257/516, 528; 438/234, 328; 327/109  
See application file for complete search history.

(56) References Cited

U.S. PATENT DOCUMENTS

| | | | | |
|---|---|---|---|---|
| 4,777,386 A | * | 10/1988 | Majumdar | .................. 327/109 |
| 5,631,588 A | * | 5/1997 | Bertolini | ...................... 327/108 |
| 5,883,537 A | * | 3/1999 | Luoni et al. | ................. 327/318 |
| 6,127,723 A | * | 10/2000 | Aiello et al. | ................. 257/582 |
| 6,441,445 B1 | * | 8/2002 | Leonardi et al. | ............ 257/378 |
| 6,441,446 B1 | * | 8/2002 | Patti | ........................... 257/378 |

FOREIGN PATENT DOCUMENTS

| | | |
|---|---|---|
| EP | 0 219 925 A1 | 4/1987 |
| EP | 0 959 562 A1 | 11/1999 |

OTHER PUBLICATIONS

Baribaud, Michel et al., "Générateur d'impulsions linéaires de courant de forte intensité," *L'Onde Electrique*, 64(5):21-28, Sep.-Oct. 1984.

* cited by examiner

*Primary Examiner*—Thomas L. Dickey  
(74) *Attorney, Agent, or Firm*—Lisa K. Jorgenson; E. Russell Tarleton; Seed IP Law Group PLLC

(57) ABSTRACT

An emitter switching configuration having at least one bipolar transistor and a MOS transistor having a common conduction terminal and a Zener diode inserted between a control terminal of the bipolar transistor and the common conduction terminal. A monolithic structure is also provided that is effective in implementing the emitter switching configuration.

9 Claims, 2 Drawing Sheets

EMITTER SWITCHING CONFIGURATION AND CORRESPONDING INTEGRATED STRUCTURE

BACKGROUND OF THE INVENTION

1. Field of the Invention

The present invention relates to an emitter switching configuration and, more specifically, the invention relates to an emitter switching configuration comprising at least a bipolar transistor and a MOS transistor having a common conduction terminal and to an integrated structure effective to implement the emitter switching configuration to be integrated on a single chip.

2. Description of the Related Art

As it is well known, in applications requiring a high switching speed of a switch implemented by means of a bipolar transistor, this bipolar transistor is associated with a MOS transistor, inserted in series with an emitter terminal of the bipolar transistor in the configuration commonly known as emitter switching, schematically shown in FIG. 1 and globally indicated with 1.

The emitter switching configuration 1 essentially has a bipolar transistor T1 with a collector terminal C1, an emitter terminal E1, and a control or base terminal B1. The emitter terminal E1 of transistor T1 is connected to a drain terminal D1 of a MOS transistor M1 having also a source terminal S1 and a control or gate terminal G1.

Advantageously, by using the emitter switching configuration 1, the lock of the MOS transistor M1 allows transistor T1 to be rapidly turned off since it cuts the emitter current thereof.

Moreover the emitter switching configuration 1 can be integrated in a single chip, forming the MOS transistor M1 in a diffusion related to the emitter terminal E1 of the bipolar transistor T1. The MOS transistor M1 will be N or P-channel according to whether the emitter terminal E1 is of the N or P type.

The MOS transistor drain terminal D1 therefore corresponds to the emitter terminal E1 of the bipolar transistor T1. The so-formed MOS transistor M1 is particularly a VDMOS transistor, i.e., a double-diffusion vertical MOS transistor.

Being the emitter terminal region of a bipolar transistor an heavily doped semiconductor region, in order to integrate a MOS transistor therein a particular monolithic structure is to be used, such as the one shown in FIG. 2.

Particularly, the monolithic structure 2 has a semiconductor substrate 21 of a first conductivity type, for example of the N type, effective to form the collector terminal C1 of the bipolar transistor T1.

A first buried layer 22 of a second conductivity type, for example of the P type, is formed on the substrate 21 and a second buried layer 23 of the first conductivity type.

The monolithic structure 2 thus has an epitaxial layer 24 of the first conductivity type covering the first 22 and second 23 buried layers.

A double-diffusion region of the second conductivity type 25 is formed in the epitaxial layer 24, corresponding to body or bulk regions of the MOS transistor M1, wherein a high-concentration double-diffusion region 26 of the first conductivity type is formed, corresponding to the source region S1 of the MOS transistor M1. The monolithic structure 2 also includes polysilicon structures 27 effective to form the gate terminal G1 of the MOS transistor M1.

The monolithic structure 2 is completed by a contact structure 28A effective to form the source terminal S1 of the MOS transistor M1, as well as a contact structure 28B effective to form the base terminal B1 of the bipolar transistor T1 and in contact with the first buried layer 22 by means of convenient wells 29 of the second conductivity type.

It is worth noting that in the monolithic structure 2 the buried layers 22 and 23 form the emitter and base regions of the bipolar transistor T1, these regions being buried by means of a higher-resistivity epitaxial layer 24 wherein the body regions 25 of the MOS transistor M1 are diffused. Moreover, the epitaxial layer 24 is the drain region of the MOS transistor M1.

The emitter switching configuration 1 being integrated by means of the monolithic structure 2 is driven as an insulated gate device, essentially of the power MOS type. However, the emitter switching configuration 1 has advantageously a lower resistance in conduction conditions than known power MOS devices. This advantage is further increased if the inverse voltage value to be undergone by the device increases, i.e., the voltage rating.

Particularly, the monolithically-integrated emitter switching configuration 1 has a low-voltage MOS transistor M1, and it has thus a low conduction resistance value Ron. Besides, in lock conditions, the entire inverse voltage applied to the emitter switching configuration 1 is supported by the base-collector junction of the bipolar transistor T1 without affecting thus the body-drain junction of the MOS transistor M1.

The body-drain junction of the MOS transistor M1 is stressed only in the turn-off step. In fact, in the turn-off step, the entire current of the bipolar transistor T1 collector terminal C1, being no more allowed to flow through the emitter terminal E1 thereof which is locked by the MOS transistor M1 turn-off, is obliged to leave the base terminal B1 of the bipolar transistor T1 by passing thus through the first buried layer 22 and wells 29. The body-drain junction of the MOS transistor M1 thus undergoes an inverse voltage $V_{MOS}$ given by:

$$V_{MOS}=Ic*RB$$

where RB is the resistance of the second buried layer 22 and of the wells 29 and Ic is the current to be switched.

It is thus evident that, if the value of the current Ic to be switched is too high, the body-drain junction of the MOS transistor M1 can breakdown, interrupting thus the bipolar transistor T1 turn-off step. The latter, undergoing high inverse voltages with simultaneous high current flowing, can be thus seriously damaged or even destroyed.

Definitely, the highest current Ic value, or current capability, which can be switched by the bipolar transistor T1 in the emitter switching configuration depends on the breakdown voltage value of the MOS transistor M1.

In other words, the increase in the "current capability" of the bipolar transistor T1 is obtained at the detriment of the conduction resistance Ron of the MOS transistor M1 and thus of the whole monolithic structure 2 in the emitter switching configuration.

BRIEF SUMMARY OF THE INVENTION

The technical problem underlying the present invention is to provide an emitter switching configuration for a bipolar transistor, having such functional and structural characteristics as to overcome the limitations still affecting prior art configurations.

The disclosed embodiment of the present invention uses the bipolar transistor base-emitter junction as a limit for the voltage applied to the drain terminal of the MOS transistor associated thereto in the emitter switching configuration preventing thus the body-drain junction of the MOS transistor to be in breakdown conditions.

In accordance with one embodiment of the invention, an emitter switching configuration is provided that includes at least one bipolar transistor and a MOS transistor having a common conduction terminal; and a Zener diode inserted between a control terminal of the bipolar transistor and the common conduction terminal. Ideally, the Zener diode has a lower Zener voltage than a breakdown voltage of a junction between the control terminal and the common conduction terminal of the bipolar transistor.

In accordance with another aspect of the foregoing embodiment, the conduction terminal corresponds to an emitter terminal of the bipolar transistor and to a drain terminal of the MOS transistor, and the Zener diode has an anode terminal connected to the control terminal of the bipolar transistor and a cathode terminal connected to the common conduction terminal of the bipolar transistor.

In accordance with another aspect of the foregoing invention, an emitter switching circuit is provided that includes a bipolar transistor having a base-to-emitter device coupled to a drain terminal of a MOS transistor and configured to prevent a breakdown condition of a body-drain junction of the MOS transistor.

In accordance with another aspect of the foregoing embodiment, the base-to-emitter device comprises a Zener diode. Ideally the diode is configured to have a breakdown voltage that is less than a breakdown voltage of a base-to-emitter device of the bipolar transistor.

In accordance with another aspect of the present invention, an integrated circuit is provided that includes a substrate of first conductivity type having a first layer formed thereon of a second conductivity type and a second layer formed on said first layer of the first conductivity type, and an epitaxial layer covering the first and second layers, the epitaxial layer having the first conductivity type; first wells of the second conductivity type formed in the epitaxial layer to contact the first layer, and second wells of the first conductivity type formed in the epitaxial layer adjacent to and in contact with the first wells and with the second layer to define in combination with the first wells a Zener diode having an anode terminal connected to a base terminal of a bipolar transistor formed in association with the epitaxial layer and a cathode terminal coupled to an emitter terminal of the bipolar transistor and a drain terminal of a MOS transistor formed in association with the epitaxial layer.

In accordance with another aspect of the foregoing embodiment of the invention, the first and second wells are doped such that a breakdown voltage of a junction between the first and second wells is lower than a breakdown voltage of a junction formed between the base terminal and the emitter terminal of the bipolar transistor.

BRIEF DESCRIPTION OF THE DRAWINGS

The features and advantages of the emitter switching configuration and of the integrated structure according to the invention will be apparent from the following description of an embodiment thereof given by way of non-limiting example with reference to the attached drawings.

In the drawings.

DETAILED DESCRIPTION OF THE INVENTION

Figure 1:
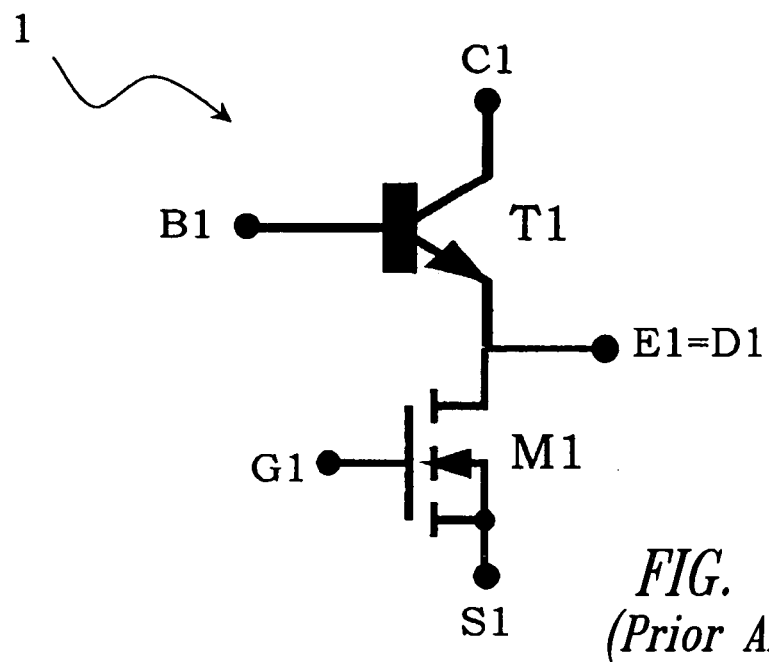
FIG. 1 schematically shows an emitter switching configuration according to the prior art.
Figure 2:
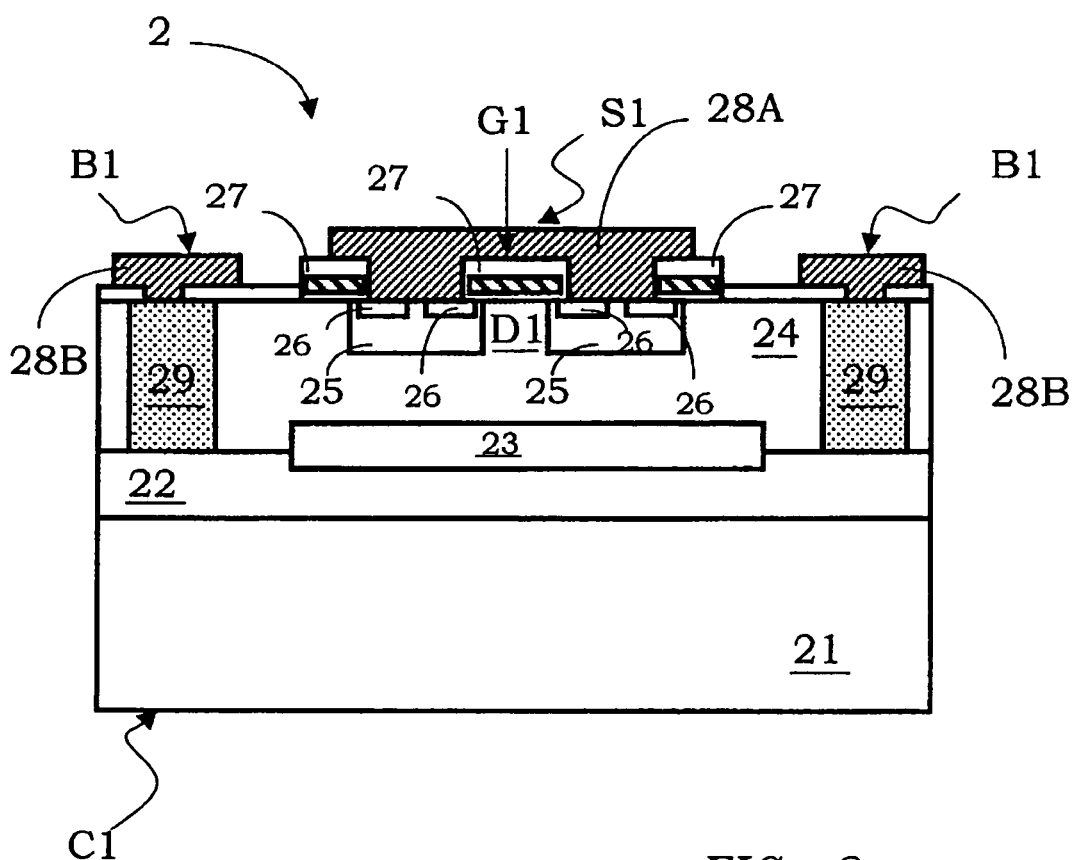
FIG. 2 schematically shows an integrated structure effective to implement the emitter switching configuration of FIG. 1.
Figure 3:
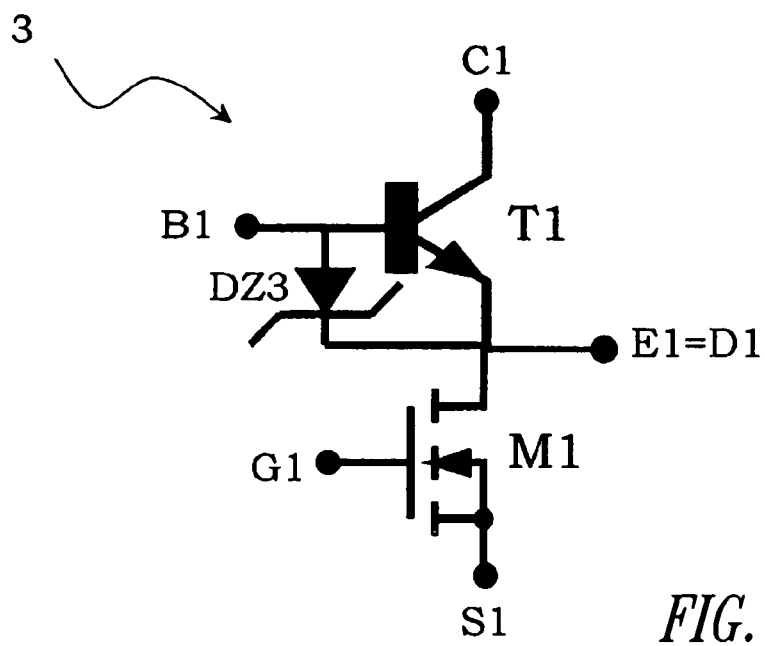
FIG. 3 schematically shows an emitter switching configuration according to the invention.

With reference to the figures, and particularly to FIG. 3, an emitter switching configuration according to the invention is globally and schematically indicated with 3. Numeral references to elements being structurally and functionally identical to the prior art description with reference to FIGS. 1 and 2 have been retained.

It is to be understood that the figures showing schematic views of portions of an integrated circuit are not drawn to scale, but they are drawn, on the contrary, so as to emphasize the important features of the invention. Moreover they do not form a complete integrated structure, only the layers that are necessary to understand the invention described and shown herein.

FIG. 3 shows therefore an emitter switching configuration 3 according to the invention and including a bipolar transistor T1 having a collector terminal C1, an emitter terminal E1, and a control or base terminal B1. The emitter terminal E1 of the transistor T1 is connected to a drain terminal D1 of a MOS transistor M1 having also a source terminal S1 and a control or gate terminal G1.

Advantageously according to the invention, the emitter switching configuration 2 comprises also a Zener diode DZ3 inserted between the base terminal B1 and the emitter terminal E1 of the bipolar transistor T1 and having a Zener voltage lower than the base-emitter junction breakdown voltage of the bipolar transistor T1.

Particularly, the Zener diode DZ3 has an anode terminal corresponding to the base terminal B1 and a cathode terminal corresponding to the emitter terminal E1.

Figure 4:
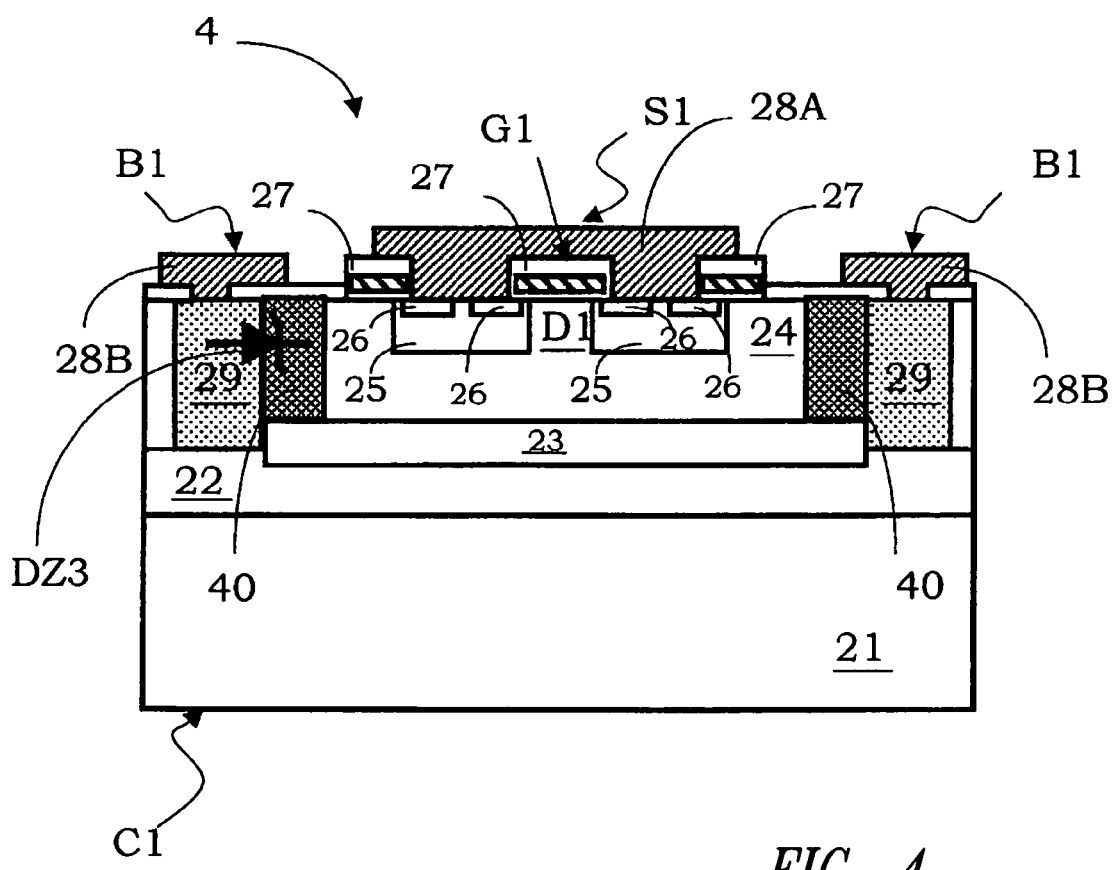
FIG. 4 schematically shows an integrated structure effective to implement the emitter switching configuration of FIG. 3.

As seen with respect to the prior art, the emitter switching configuration 3 can be integrated in a single chip by using a monolithic structure 4, shown in FIG. 4.

Particularly, the monolithic structure 4 comprises a semiconductor substrate 21 of a first conductivity type, for example of the N type, effective to form the collector terminal C1 of the bipolar transistor T1.

A first buried layer 22 of a second conductivity type, for example of the P type, is formed on the substrate 21 and a second buried layer 23 of the first conductivity type.

The monolithic structure 4 comprises thus an epitaxial layer 24 of the first conductivity type covering the first 22 and second 23 buried layers.

A double-diffusion region of the second conductivity type 25 is formed in the epitaxial layer 24, corresponding to the body or bulk regions of the MOS transistor M1, wherein a high-concentration double-diffusion region 26 of the first conductivity type is formed, corresponding to the source region S1 of the MOS transistor M1. The monolithic structure 4 also includes polysilicon structures 27 effective to form the gate terminal G1 of the MOS transistor M1.

The monolithic structure 4 is completed by a contact structure 28A effective to form the source terminal S1 of the MOS transistor M1 and overlapped to contact structures 27, as well as a contact structure 28B effective to form the base terminal B1 of the bipolar transistor T1 and in contact with the first buried layer 22 by means of convenient wells 29 of the second conductivity type.

In the monolithic structure 4, the buried layers 22 and 23 form the emitter and base regions of the bipolar transistor T1, these regions being buried by means of a higher-resistivity epitaxial layer 24 wherein the body regions 25 of the MOS transistor M1 are diffused.

Moreover, the epitaxial layer 24 is the drain region of the MOS transistor M1.

Advantageously according to the invention, the monolithic structure 4 includes heavily-doped wells 40 of the first conductivity type, adjacent to the wells 29 of the second conductivity type and in contact with these wells 29 and with the second buried layer 23.

Wells 29 and 40 thus define a P-N junction effective to implement the Zener diode DZ3. With both wells 29 and 40 heavily doped, the Zener diode formed therefrom has a lower breakdown voltage than the voltage of the junction formed by the buried layers 22 and 23, which are not as heavily doped.

Advantageously according to the invention, the Zener diode DZ3 limits the base-emitter junction voltage value of the bipolar transistor T1, whose breakdown value is therefore quite lower than the MOS transistor M1 value. Substantially, the Zener diode DZ3 serves as clamp to the voltage increase at the drain terminal D1 of the MOS transistor M1 which is not thus in the breakdown condition.

In fact it is to be remembered that the breakdown voltage value of the bipolar transistor T1 base-emitter junction depends on the doping level of the deep layers 22 and 23. In particular, the higher the doping levels of these layers, the lower will be the breakdown voltage value of the base-emitter junction. These doping levels cannot be increased at will since this would excessively decrease the bipolar transistor T1 gain.

The integration of the Zener diode DZ3, in parallel with the base-emitter junction of the bipolar transistor T1, allows the above-mentioned limit to be overcome, since the Zener voltage of diode DZ3 is lower than the breakdown voltage of the bipolar transistor T1 base-emitter junction.

It is therefore possible to use in the emitter switching configuration 2 according to the invention a MOS transistor M1 with a low breakdown voltage and, subsequently, a low conduction resistance Ron. Obviously, this affects the current capacity of the whole monolithic structure 4 implementing the emitter switching configuration 2.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A monolithic structure effective to implement an emitter switching configuration, comprising at least one bipolar transistor and a MOS transistor having a common conduction terminal; at least one substrate having a first conductivity type whereon a first buried layer having a second conductivity type and a second buried layer having said first conductivity type are formed, said first and second buried layers covered by an epitaxial layer having said first conductivity type, said first buried layer forming, by means of first wells of said second conductivity type a control terminal of said bipolar transistor, and said second buried layer forming said common conduction terminal; and second wells of said first conductivity type, adjacent to said first wells of said second conductivity type and in contact with said first wells and with said second buried layer to define a Zener diode parallel to a junction defined by said first and second buried layers with a node of the Zener diode coupled to the control terminal of the bipolar transistor and a cathode coupled to the common conduction terminal.

2. The monolithic structure of claim 1 wherein said first and second wells are more heavily doped than the first and second buried layers.

3. The monolithic structure of claim 1, wherein the Zener diode has a lower Zener voltage than a breakdown voltage of a junction between the control terminal of the bipolar transistor and the common conduction terminal.

4. An integrated emitter switching circuit, comprising:
a substrate of first conductivity type having a first layer formed thereon of a second conductivity type and a second layer formed on said first layer of the first conductivity type, and an epitaxial layer covering the first and second layers, the epitaxial layer having the first conductivity type;
first wells of the second conductivity type formed in the epitaxial layer to contact the first layer and second wells of the first conductivity type formed in the epitaxial layer adjacent to and in contact with the first wells and with the second layer to define in combination with the first wells a Zener diode having an anode terminal connected to a base terminal of a bipolar transistor formed in association with the epitaxial layer and a cathode terminal coupled to an emitter terminal of the bipolar transistor and a drain terminal of a MOS transistor formed in association with the epitaxial layer.

5. The integrated circuit of claim 4 wherein the first and second wells are doped such that a breakdown voltage of a junction between the first and second wells is lower than a breakdown voltage of a junction formed between the base terminal and the emitter terminal of the bipolar transistor.

6. The integrated circuit of claim 5, further comprising first and second double diffusing regions of the second conductivity type formed in the epitaxial layer, each double-diffusion region comprising first and second high-concentration double-diffusion regions of the first conductivity type formed therein and corresponding to source regions of the MOS transistor, and further comprising a polysilicon structure formed on the epitaxial layer and in communication with the high-concentration double-diffusion regions of the first and second double-diffusion regions to form a gate terminal of the MOS transistor.

7. The integrated circuit of claim 6 wherein the first wells also contact the second layer.

8. The integrated circuit of claim 4, wherein:
the bipolar transistor includes a collector terminal and an emitter terminal along with the base terminal;
the MOS transistor has a gate terminal and a collector terminal along with the drain terminal of the MOS transistor coupled to the emitter terminal of the bipolar transistor at a first node; and
the Zener diode configured to have a lower Zener voltage than a breakdown voltage between the base terminal of the bipolar transistor and the first terminal of the MOS transistor.

9. The circuit of claim 8, wherein the MOS transistor comprises a vertical double-diffusion type transistor.

* * * * *